(12) United States Patent
Dubey

(10) Patent No.: US 8,779,862 B2
(45) Date of Patent: Jul. 15, 2014

(54) MATRIX STRUCTURE OSCILLATOR

(75) Inventor: Prashant Dubey, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 171 days.

(21) Appl. No.: 13/550,195

(22) Filed: Jul. 16, 2012

(65) Prior Publication Data

US 2012/0280756 A1 Nov. 8, 2012

Related U.S. Application Data

(63) Continuation of application No. 12/644,984, filed on Dec. 22, 2009, now Pat. No. 8,232,843.

(30) Foreign Application Priority Data

Dec. 22, 2008 (IN) .......................... 2908/DEL/2008

(51) Int. Cl.
*H03K 3/03* (2006.01)
*H03B 5/32* (2006.01)
*H03B 5/08* (2006.01)
*H03L 7/099* (2006.01)

(52) U.S. Cl.
CPC ............... *H03K 3/0315* (2013.01); *H03B 5/08* (2013.01); *H03B 5/32* (2013.01); *H03L 7/0995* (2013.01); *H03B 2200/009* (2013.01)
USPC ................. 331/57; 331/46; 331/56; 331/158; 331/167

(58) Field of Classification Search
CPC ............. H03B 5/08; H03B 5/18; H03B 5/30; H03B 5/32; H03B 27/00; H03B 2200/0074; H03B 2200/0088; H03B 2200/009; H03K 3/03; H03K 3/0315; H03K 3/0322; H03K 3/027; H03K 3/0307; H03K 3/0231; H03K 3/354; H03K 3/3545; H03L 7/0995; H03L 7/24
USPC ...... 331/2, 45, 46, 50, 55–57, 117 FE, 117 R, 331/158, 167
See application file for complete search history.

(56) References Cited

U.S. PATENT DOCUMENTS

| | | | | |
|---|---|---|---|---|
| 5,592,126 | A * | 1/1997 | Boudewijns et al. | 331/45 |
| 5,592,127 | A * | 1/1997 | Mizuno | 331/57 |
| 6,137,369 | A * | 10/2000 | Kermani | 331/45 |
| 6,856,208 | B2 | 2/2005 | Lee et al. | |
| 6,922,112 | B2 * | 7/2005 | Kurd et al. | 331/57 |
| 7,135,935 | B2 | 11/2006 | Kim | |
| 7,449,961 | B2 | 11/2008 | Sai et al. | |
| 7,777,580 | B2 * | 8/2010 | Dosho et al. | 331/57 |
| 8,130,608 | B2 * | 3/2012 | Matsumoto et al. | 369/47.48 |
| 8,154,352 | B2 * | 4/2012 | Ueno | 331/57 |
| 8,212,622 | B2 * | 7/2012 | Fujiwara et al. | 331/57 |
| 2008/0197931 | A1 * | 8/2008 | Ueno | 331/57 |
| 2009/0309667 | A1 * | 12/2009 | Kim et al. | 331/57 |

* cited by examiner

*Primary Examiner* — Levi Gannon
(74) *Attorney, Agent, or Firm* — Seed IP Law Group PLLC

(57) ABSTRACT

An oscillator having a plurality of operatively coupled ring oscillators arranged in hyper-matrix architecture. The operatively coupled ring oscillators are either identical or non-identical and are coupled through a common inverter or tail current transistors. Due to the arrangement of the ring oscillators in a hyper-matrix structure, the ring oscillators are synchronized and resist any variation in frequency or phase thereby maintaining a consistent phase noise performance.

20 Claims, 8 Drawing Sheets

MATRIX STRUCTURE OSCILLATOR

BACKGROUND

1. Technical Field

The present disclosure relates to oscillators and, more specifically, to hyper matrix structure oscillators.

2. Description of the Related Art

Of various existing applications, ring oscillators are a prime component in VCOs (Voltage Controlled Oscillators) and CCOs (Current Controlled Oscillators) and are used as clock generators to provide a desired frequency. However there are fluctuations in phase during the operation of a ring oscillator as a clock generator. This results in phase noise, which hinders efficient frequency generation.

To increase the phase noise performance, an increased bias current is required, which further requires an increase in area. MEMS- and LC-based oscillators may be used; however, these oscillators require substantial topographical area and are costly in terms of manufacture and current consumption.

BRIEF SUMMARY

The various embodiments of the present disclosure pertain to an oscillator having a plurality of ring oscillators arranged in a hyper matrix structure. The ring oscillators constituting the oscillator in the present disclosure are either identical ring oscillators or non-identical oscillators. The ring oscillators are operatively coupled to each other either by a common inverter or tail current transistors. The plurality of ring oscillators works in synchronization and converges to a nominal frequency with a nominal phase. In accordance with the principle of synchronization, any shift in the nominal phase and frequency is resisted by the set of oscillators in unison. Therefore, the hyper matrix structure of a plurality of ring oscillators increases power dissipation at a particular frequency using simple VCOs or CCOs or both, and it reduces phase noise. There is no increase in the bias current per VCO, thus simplifying the design of the bias circuit.

Ideally, the output voltages of N identical ring oscillators are added in phase. The total carrier power is multiplied by $N^2$, however, uncorrelated noise power increases by N. Thus, the phase noise relative to the carrier decreases by a factor of N at the cost of a proportional increase in power dissipation.

According to another embodiment of the present disclosure, a system includes an oscillator wherein the oscillator has a plurality of operatively coupled ring oscillators arranged in a hyper-matrix structure. The operatively coupled ring oscillators are either identical or non-identical and are coupled through a common inverter or tail current transistors. Due to the arrangement of the ring oscillators in a hyper-matrix structure, the ring oscillators are synchronized and resist any variation in frequency or phase, thereby maintaining a consistent phase noise performance.

Another embodiment of the present disclosure refers to a method to improve the phase noise performance in an oscillator. The method includes operatively coupling of a plurality of ring oscillators in a hyper-matrix structure. Such an arrangement in a hyper matrix structure ensures that the ring oscillators are synchronized and therefore, any variation in frequency or phase are avoided. Therefore, an efficient phase noise performance is achieved. The ring oscillators in the present embodiment are either identical or non-identical in nature.

In accordance with another aspect of the present disclosure a circuit is provided that includes at least two ring oscillators, each ring oscillator including a plurality of oscillators coupled together via an inverter between each pair of oscillators, the at least two ring oscillators coupled together via at least one tail current transistor or a common inverter or a common ring oscillator to form an oscillator cell.

In accordance with another aspect of the foregoing embodiment, the at least two ring oscillators are coupled to the common ring oscillator via either a common inverter or a direct connection.

In accordance with another aspect of the foregoing embodiment of the present disclosure, the circuit includes a plurality of ring oscillator cells coupled together to form a hyper matrix structure oscillator realized in a fractal structure.

In accordance with another aspect of the foregoing embodiment, each cell is formed of multiple differential ring oscillators.

In accordance with another aspect of the foregoing embodiment, each cell is formed of a heterogeneous phase coupled ring oscillator formed of non-identical ring oscillators operatively coupled together to provide a coupling of low and high frequency ring oscillators.

BRIEF DESCRIPTION OF THE SEVERAL VIEWS OF THE DRAWINGS

Features and aspects of various embodiments of the disclosure will be better understood when the following detailed description is read with reference to the accompanying drawings in which like characters represent like parts throughout the drawings.

DETAILED DESCRIPTION

Figure 1:
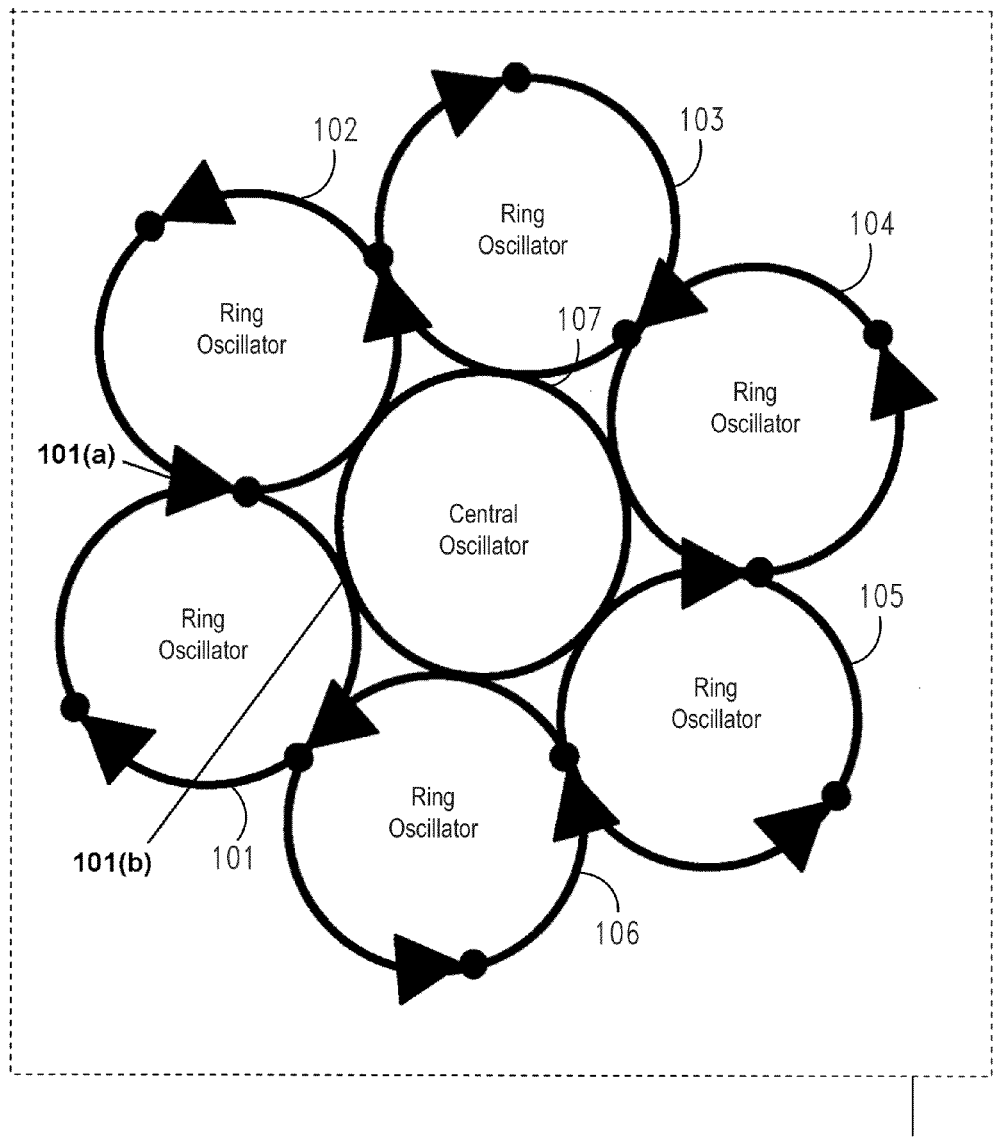
FIG. 1 illustrates a cell according to an embodiment of the present disclosure.

The embodiments of the present disclosure will be described in detail with reference to the accompanying drawings. However, the present disclosure is not limited to these embodiments. The present disclosure can be modified in various forms. The embodiments of the present disclosure described herein are only provided to explain more clearly the present disclosure to the ordinarily skilled in the art. In the accompanying drawings, like reference numerals are used to indicate like components.

The terms identical ring oscillators and non-identical ring oscillators have been used throughout the disclosure. Identical ring oscillators indicate that all ring oscillators are of the same stage i.e., all ring oscillators are 3-stage ring oscillators or 5-stage ring oscillators etc. Non-identical ring oscillators indicate that all ring oscillators coupled to each other are of different stages i.e., a 3-stage ring oscillator is coupled to a 5-stage ring oscillator which is further coupled to a 7-stage ring oscillator etc. Such non-identical ring oscillators coupled to each other are also referred to as heterogeneously phase coupled oscillators.

FIG. 1 illustrates a cell 100 with ring oscillators 101-106 operatively coupled to a central oscillator 107 according to an embodiment of the present disclosure. The figure shows 3-stage ring oscillators 101, 102, 103, 104, 105 and 106 operatively coupled to a central oscillator 107. The central oscillator 107 is a general oscillator such as an LC oscillator or a crystal oscillator. Coupling between the oscillators is achieved either through an inverter unit 101(a) common to two oscillators or through a short or direct connection between a ring oscillator and the central oscillator 101(b).

Coupling between the oscillators can be in a linear configuration such as resistive, capacitive, and inductive or in a nonlinear configuration such as through OP-AMPs, inverters, and Phase Frequency Detectors (PFDs). This helps achieve predictive and efficient output in terms of phase noise.

Figure 2:
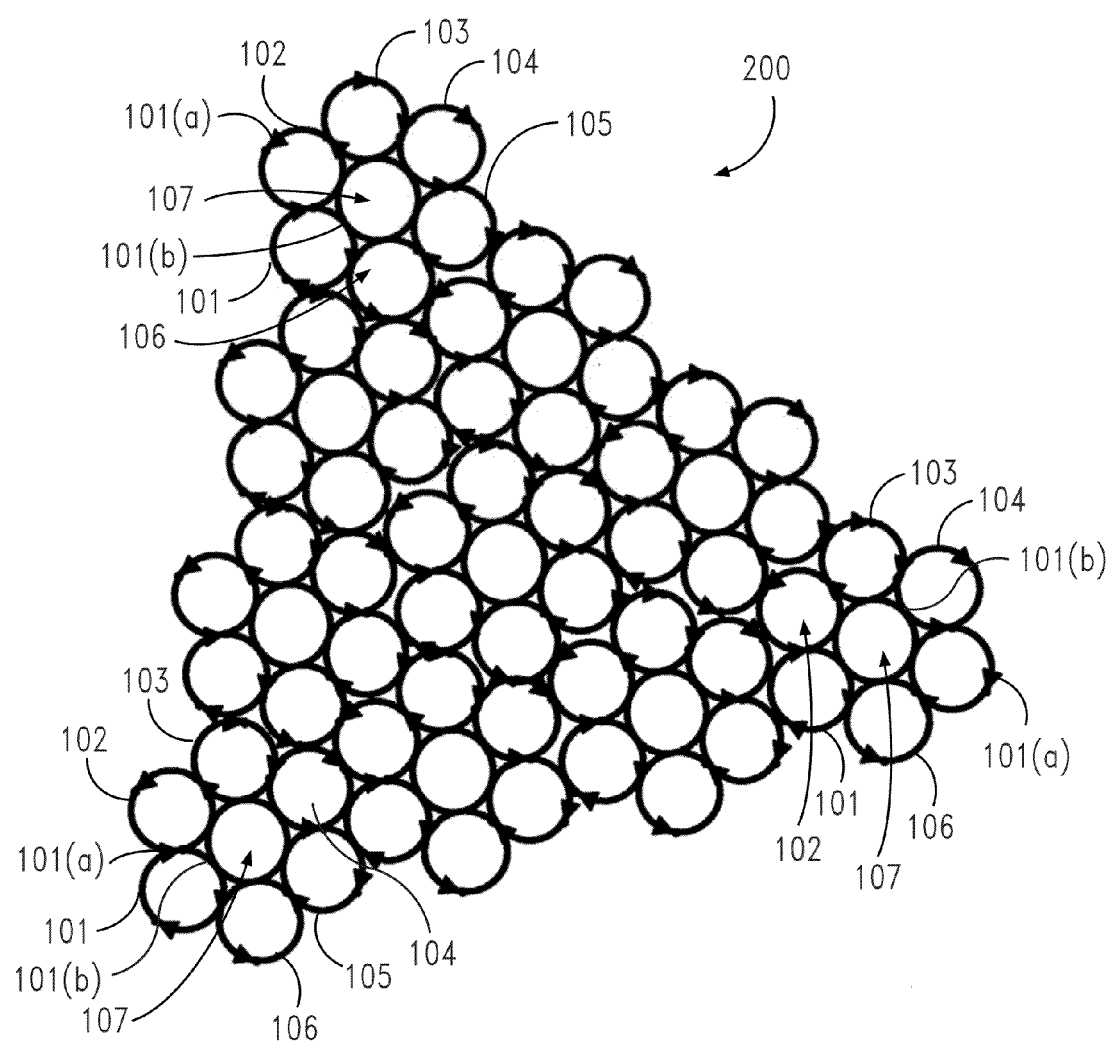
FIG. 2 shows a hyper matrix structure ring oscillator in accordance with the embodiment illustrated in FIG. 1.

FIG. 2 shows a hyper matrix structure ring oscillator 200 formed of a plurality of cells 100 described above in FIG. 1. The cell 100 as described in FIG. 1 is replicated at multiple stages throughout the system 200, thus forming a hyper matrix structure ring oscillator. Thus, any variation in frequency or phase is resisted by the oscillators in unison and phase noise is reduced without any increase in the bias current.

Figure 3:
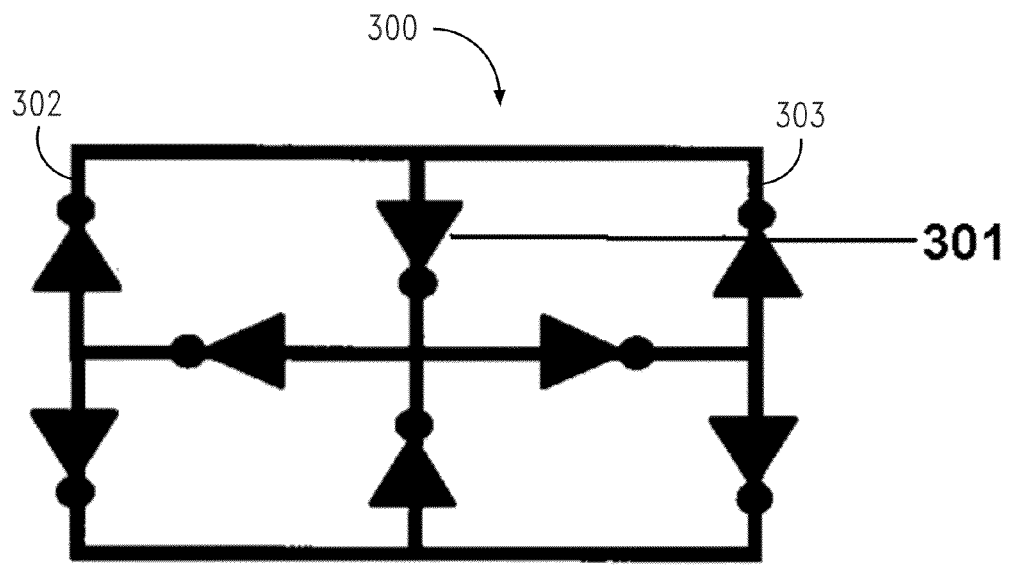
FIG. 3 illustrates a plurality of identical ring oscillators operatively coupled to each other according to an embodiment of the present disclosure.

In accordance with an embodiment of the present disclosure illustrated in FIG. 3, a cell 300 includes a set of identical ring oscillators operatively coupled to each other. As an example of the present embodiment, a 3-stage ring oscillator 302 is coupled to a 3-stage ring oscillator 303 by a common inverter 301 as shown. Such a coupling is also referred to as homogenous coupling of oscillators.

Figure 4:
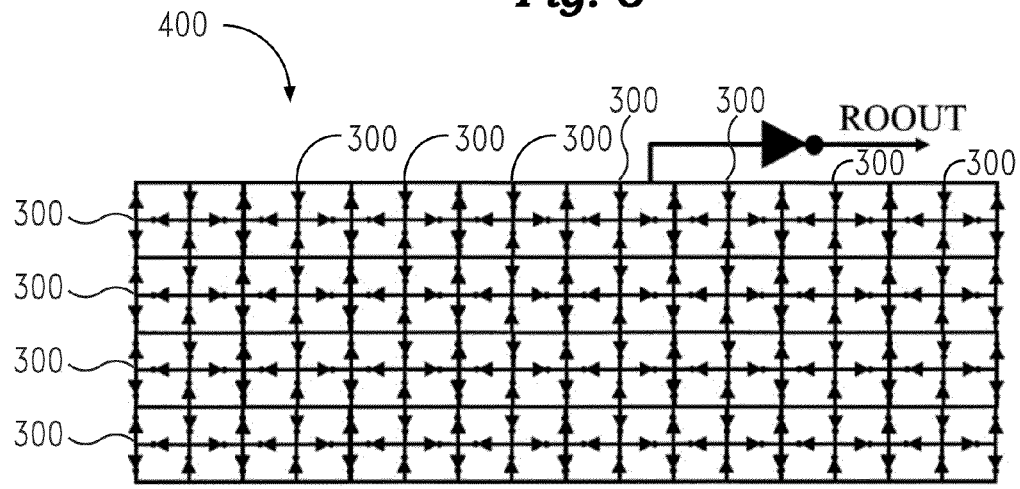
FIG. 4 illustrates a hyper matrix structure oscillator in accordance with the embodiment shown in FIG. 3.

The cell described in the present embodiment is replicated in hyper matrix structure 400 as illustrated in FIG. 4. FIG. 4 also, as an embodiment of the present disclosure, reduces the phase noise without increasing the bias current.

Figure 5:
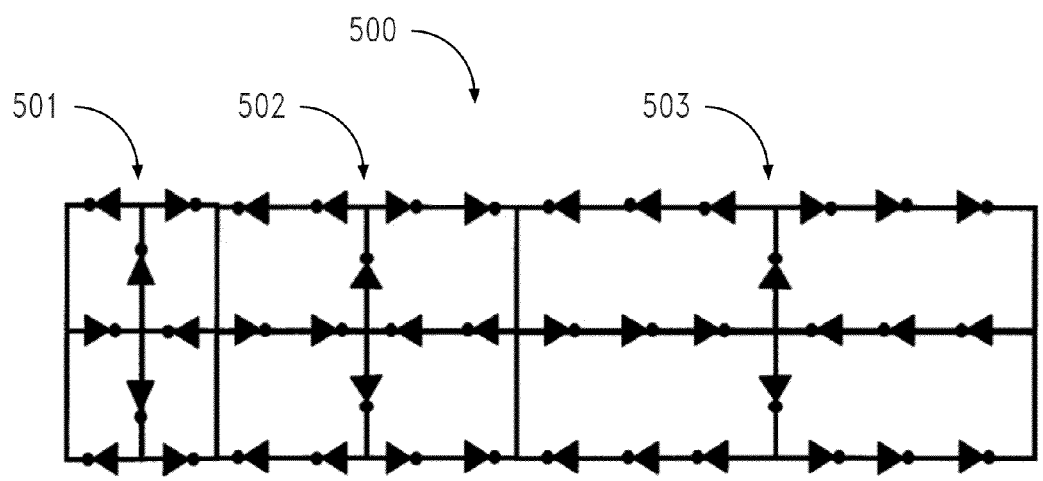
FIG. 5 shows an embodiment of the present disclosure with heterogeneously phase coupled ring oscillators operatively coupled to each other.

In accordance with an embodiment of the present disclosure as shown in FIG. 5, a cell 500 includes a set of non-identical ring oscillators operatively coupled to each other. Thus, such a configuration of ring oscillators results in a cell having a set of heterogeneous phase coupled oscillators. The figure shows a 3-stage ring oscillator 501 operatively coupled to a 5-stage ring oscillator 502 further coupled to a 7-stage ring oscillator 503. A 3-stage ring oscillator will have a higher frequency as compared to a 5-stage or 7-stage ring oscillator. The cell as described is replicated at multiple stages and due to synchronization of the coupled oscillators; the phase noise reduces without increase in bias current.

As another example of the above mentioned embodiment of the present disclosure, a ring oscillator operating at 8 MHz frequency or 16 MHz frequency may be coupled with a ring oscillator operating at 2048 MHz. Therefore there will be multiple cells where 8 MHz ring oscillators are coupled to 2048 MHz ring oscillators and multiple cells where 16 MHz ring oscillators are coupled to 2048 MHz ring oscillators. Due to synchronization of the coupled oscillators; the phase noise reduces without increase in bias current.

The heterogeneous phase coupling as described in the above mentioned embodiments primarily provides a coupling of low and high frequency ring oscillators. Due to such coupling, low phase noise is achieved with low power consumption. The phase noise is reduced more effectively in the case of heterogeneous phase coupling as compared to homogenous coupling.

Figure 6:
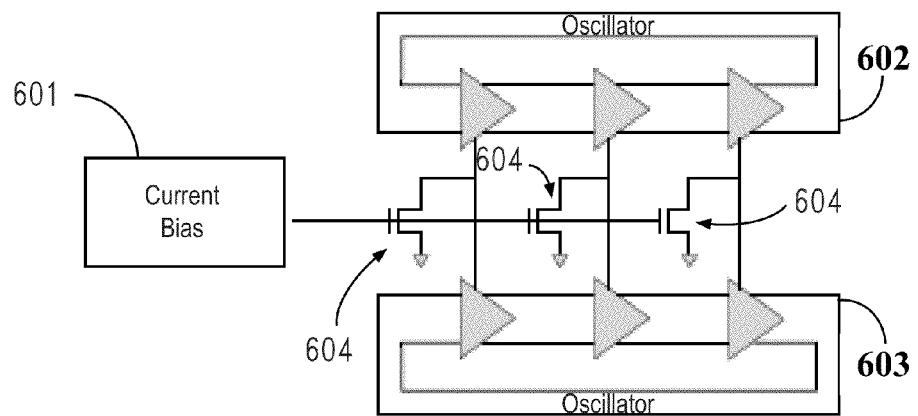
FIG. 6 shows coupling between multiple differential oscillators in a cell according to yet another embodiment of the present disclosure.

FIG. 6 shows coupling between multiple differential ring oscillators in a cell according to yet another embodiment of the present disclosure. Two differential ring oscillators 602 and 603 are fed by a current bias 601. Tail current transistors 604 between the two ring oscillators 602 and 603 are shared to achieve coupling. The cell as shown is then replicated at multiple levels in the system to reduce fluctuation in variation of phase and hence reduce phase noise without the requirement of increasing the bias current.

According to another embodiment of the present disclosure, the hyper matrix structure of a plurality of cells having a set of oscillators is realized in Fractal based structure. In generic terms fractals are described as a family of complex shapes that possess an inherent self-similarity or self-affinity in their geometrical structure. It is a geometric figure, built up from a simple shape, by generating the same or similar changes on successively smaller scales. Fractal based structure leads to higher efficiency in terms of area management.

Figure 7:
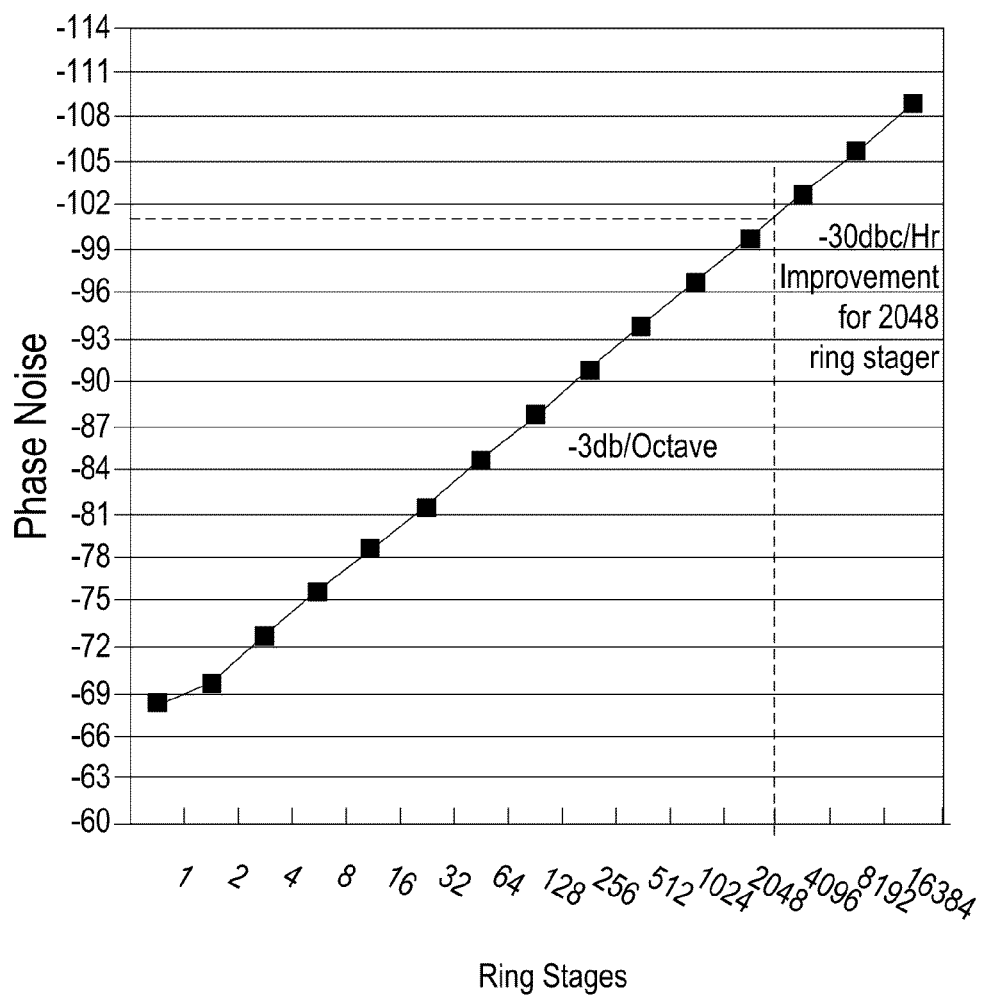
FIG. 7 illustrates a graphical representation of reduction in phase noise in accordance with various embodiments of the present disclosure.

FIG. 7 is a graphical representation of the reduction in phase noise in accordance with various embodiments of the present disclosure. The representation is plotted between phase noise which decreases over the y-axis and ring stages, which increases over the x-axis and indicates the number of cells replicated through the system. The graphical representation illustrates that as the number of ring stages are increased, the phase noise is accordingly reduced. As is evident from FIG. 7, gain in phase noise increases by −3 dBc/Octave of stages of ring oscillator.

Figure 8:
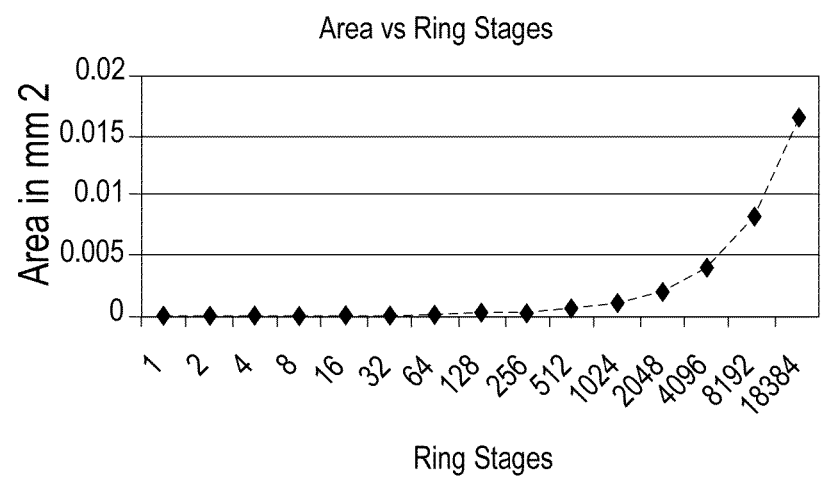
FIG. 8 illustrates a graphical representation of effective area minimization in accordance with various embodiments of the present disclosure.

FIG. 8 is a graphical representation of effective area minimization in accordance with various embodiments of the present disclosure. The number of ring stages on the x-axis is plotted against area utilization in $mm^2$ on the y-axis. The increase in area in accordance to the ring stages is minimal and thus results in effective area management.

Figure 9:
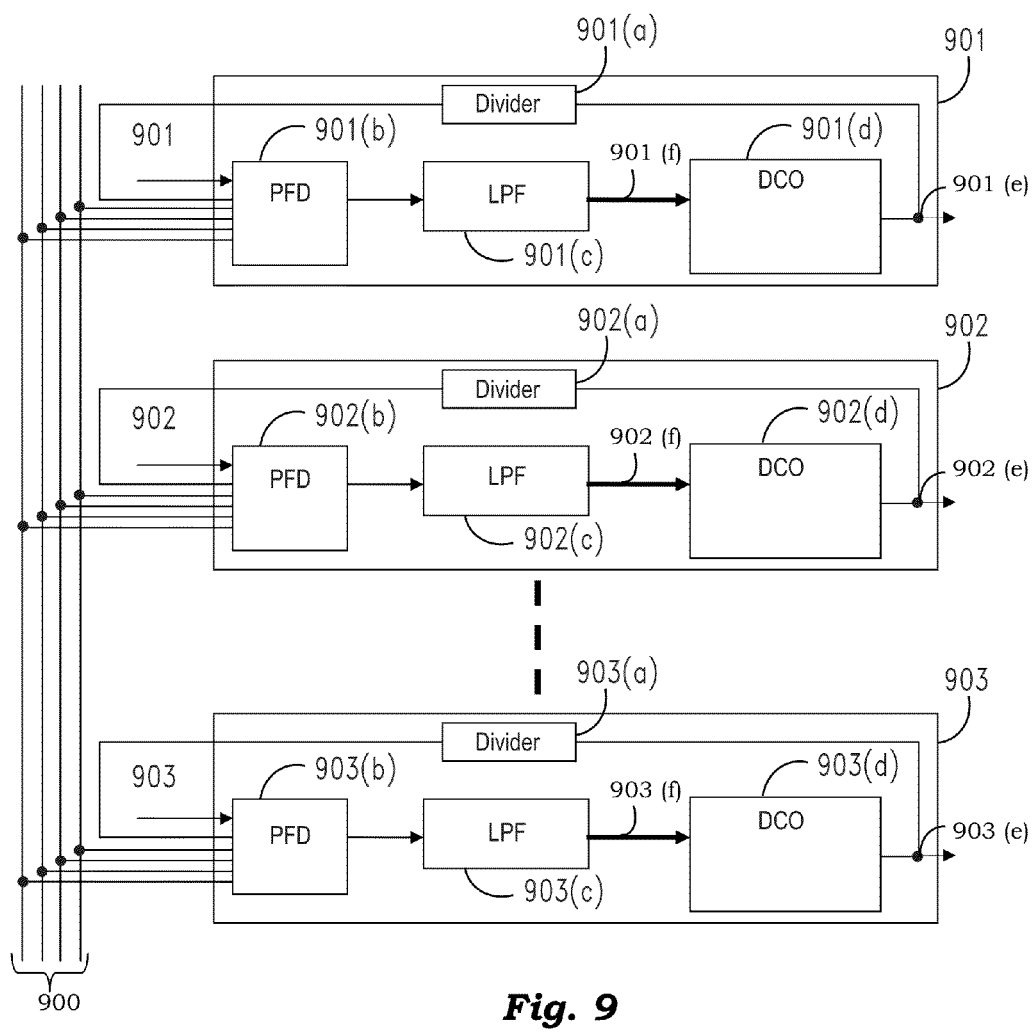
FIG. 9 illustrates an application of a hyper matrix structure oscillator shown as an embodiment in FIGS. 1 and 2 of the present disclosure.

FIG. 9 illustrates an application of the hyper matrix structure ring oscillator described as an embodiment in FIGS. 1 and 2 of the present disclosure. The hyper matrix structure ring oscillator is used in a Digitally Controlled Oscillator (DCO) core 901(d), 902(d), 903(d) of an All Digital Phase Locked Loop (ADPLL) 901, 902, 903. ADPLL 903 in the figure refers to Nth ADPLL. Multiple ADPLLs are then coupled to each other by cross coupling such that Phase Frequency Detector (PFDs) 901(b), 902(b), 903(b) of an ADPLL receives clocks from other ADPLLs as has been shown by 900, where N DCO clock outputs 901(e), 902(e), 903(e) achieved after the divider stage 901(a), 902(a), 903(a) are applied to the ADPLLs. Accordingly, an ADPLL is able to align the phase of its Voltage Controlled Oscillator (VCO) to phase of other ADPLLs. Components 901(c), 902(c), 903(c) are Digital Low Pass Filters or Integrators while 901(f), 902(f), 903(f) refer to DCO control bits.

The above mentioned use of ring oscillators in accordance with embodiments of the present disclosure for PLLs ensures that smaller area is used and better performance is delivered as compared to charge pump PLLs.

Figure 10:
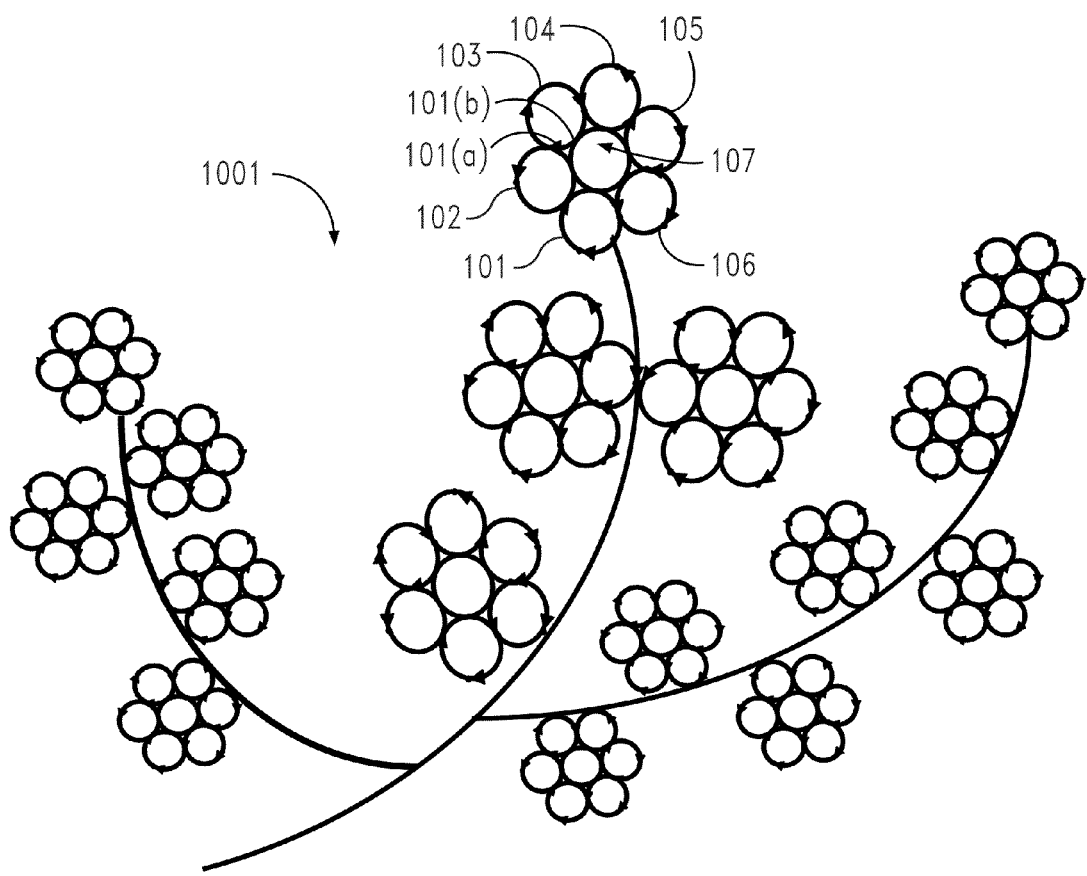
FIG. 10 illustrates yet another application of the hyper matrix structure oscillator shown as an embodiment in FIGS. 1 and 2 of the present disclosure.

Embodiments of a hyper matrix structure ring oscillator described in FIGS. 1 and 2 of the present disclosure are used to replace a clock tree network 1001, which is illustrated by FIG. 10. This helps in avoiding the effort required to balance and synthesize a clock tree. As the ring oscillators are locked to each other in phase, there is no requirement of balancing the clock trees, which in turn helps save area and power.

The various embodiments of the present disclosure provide better power routing thus achieving better synchronization and consequently effective reduction of phase noise.

Also, mismatches are effectively reduced in the hyper matrix structure of plurality of cells comprising a set of oscillators as described under various embodiments of the present disclosure.

The present disclosure is useful for frequency generation applicable in digital transceivers such as High speed serial links and Digital RF UWB, Bluetooth, WLAN, Sensor Network.

The disclosure shows and describes only the embodiments of the disclosure; however the disclosure is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the disclosure and to enable others skilled in the art to utilize the disclosure in such, or other, embodiments and with the various modifications required by the particular applications or uses of the disclosure. Accordingly, the description is not intended to limit the disclosure as disclosed herein. Also, it is intended that the appended claims be construed to include alternative embodiments.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. An oscillator, comprising:
    a plurality of oscillator cells coupled together, each oscillator cell including:
        a central oscillator that is a crystal oscillator; and
        a plurality of multi-stage ring oscillators that each have a direct connection to the central oscillator and are phase coupled to one another through shared inverters.

2. The oscillator of claim 1, wherein the direct connection between the ring oscillators and the central oscillator is a short.

3. The oscillator of claim 1, wherein the ring oscillators have a same number of stages.

4. The oscillator of claim 1, wherein the ring oscillators have a varying number of stages.

5. The oscillator of claim 1, wherein the ring oscillators are heterogeneously phase coupled to each other.

6. The oscillator of claim 1, wherein the ring oscillators are coupled together in a linear configuration.

7. The oscillator of claim 1, wherein the ring oscillators are coupled together in a nonlinear configuration.

8. A circuit, comprising:
    an oscillator having a plurality of oscillator cells coupled together, each oscillator cell including:
        a central oscillator that is an LC oscillator; and
        a plurality of multi-stage ring oscillators formed of a plurality of inverters, each ring oscillator being electrically directly connected to the central oscillator and phase coupled to consecutive ring oscillators through a shared inverter of the plurality of inverters.

9. The circuit of claim 8, wherein the direct connection between the ring oscillators and the central oscillator is a short.

10. The circuit of claim 8, wherein the ring oscillators have a same number of stages.

11. The circuit of claim 8, wherein the ring oscillators are heterogeneously phase coupled to each other.

12. The circuit of claim 8, wherein the ring oscillators are coupled together in a linear configuration.

13. The circuit of claim 8, wherein the ring oscillators are coupled together in a nonlinear configuration.

14. A system, comprising:
    a hyper-matrix structure of oscillator cells, each oscillator cell including:
        a central oscillator that is not a ring oscillator; and
        a plurality of ring oscillators, each oscillator formed of a plurality of inverters, and each ring oscillator electrically directly connected to the central oscillator and each ring oscillator phase coupled to an adjacent ring oscillator through a shared inverter of the plurality of inverters, the oscillator cells configured to work in synchronization and generate an output signal having a nominal frequency with a nominal phase.

15. The system of claim 14, wherein the direct connection between the ring oscillators and the central oscillator is a short.

16. The system of claim 14, wherein the ring oscillators have a same number of stages.

17. The system of claim 14, wherein the central oscillators is one of either an LC oscillator or a crystal oscillator.

18. The system of claim 14, wherein the ring oscillators are heterogeneously phase coupled to each other.

19. The system of claim 14, wherein the ring oscillators are coupled together in a linear configuration.

20. The system of claim 17, wherein the ring oscillators are coupled together in a nonlinear configuration.

* * * * *